(12) United States Patent
Le Toquin et al.

(10) Patent No.: US 9,335,006 B2
(45) Date of Patent: May 10, 2016

(54) SATURATED YELLOW PHOSPHOR CONVERTED LED AND BLUE CONVERTED RED LED

(75) Inventors: Ronan Le Toquin, Ventura, CA (US); Bernd Keller, Santa Barbara, CA (US); Tao Tong, Santa Barbara, CA (US); Gerald Negley, Durham, NC (US); Antony P. Van De Ven, Sai King (HK); John Roberts, Grand Rapids, MI (US)

(73) Assignee: CREE, INC., Durham, NC (US)

( * ) Notice: Subject to any disclaimer, the term of this patent is extended or adjusted under 35 U.S.C. 154(b) by 706 days.

(21) Appl. No.: 12/643,670

(22) Filed: Dec. 21, 2009

(65) Prior Publication Data
US 2010/0254129 A1 Oct. 7, 2010

Related U.S. Application Data

(63) Continuation-in-part of application No. 12/491,654, filed on Jun. 25, 2009, now Pat. No. 8,998,444, and a continuation-in-part of application No. 11/736,761, filed on Apr. 18, 2007, now Pat. No. 8,513,875, and a
(Continued)

(51) Int. Cl.
*F23Q 23/08* (2006.01)
*F21K 99/00* (2016.01)
(Continued)

(52) U.S. Cl.
CPC .... *F21K 9/00* (2013.01); *F21S 8/02* (2013.01); *F21Y 2101/02* (2013.01); *F21Y 2105/003* (2013.01); *F21Y 2113/005* (2013.01);
(Continued)

(58) Field of Classification Search
CPC combination set(s) only.
See application file for complete search history.

(56) References Cited

U.S. PATENT DOCUMENTS

| 3,674,990 A | 7/1972 | Kurauchi et al. | 235/462.16 |
| 3,900,863 A | 8/1975 | Kim | 257/95 |

(Continued)

FOREIGN PATENT DOCUMENTS

| CN | 1406450 A | 3/2003 |
| CN | 1460393 | 12/2003 |

(Continued)

OTHER PUBLICATIONS

Notice of Reasons for Rejection from Japanese Patent Application No. 2008-221738, dated: Aug. 3, 2011.
(Continued)

*Primary Examiner* — Nimeshkumar Patel
*Assistant Examiner* — Brenitra M Lee
(74) *Attorney, Agent, or Firm* — Koppel, Patrick, Heybl & Philpott

(57) ABSTRACT

SSL lamps or luminaires are disclosed that combine blue, yellow (or green) and red photons or emissions to generate light with the desired characteristics. In different embodiments according to the present invention, the blue emission is not provided by an LED chip or package having a blue LED coated with a yellow phosphor, with blue light leaking through the yellow phosphor. Instead, the blue light component can be provided by other types of LED chips in the SSL luminaire such as one having a blue LED covered by a different colored conversion material, with blue light from the blue LED leaking through the different colored conversion material. In one embodiment, the blue component can be provided by an LED chip comprising a blue emitting LED covered by a conversion material that absorbs blue light and re-emits red light, with a portion of the blue light from the LED leaking through the red conversion material.

46 Claims, 5 Drawing Sheets

Related U.S. Application Data continuation-in-part of application No. 11/948,021, filed on Nov. 30, 2007, now Pat. No. 9,084,328.

(60) Provisional application No. 61/075,513, filed on Jun. 25, 2008, provisional application No. 60/792,859, filed on Apr. 18, 2006, provisional application No. 60/793,524, filed on Apr. 20, 2006, provisional application No. 60/868,134, filed on Dec. 1, 2006.

(51) Int. Cl.
| | | |
|---|---|---|
| F21S 8/02 | (2006.01) | |
| F21Y 101/02 | (2006.01) | |
| H01L 25/075 | (2006.01) | |
| H01L 33/50 | (2010.01) | |
| F21Y 105/00 | (2016.01) | |
| F21Y 113/00 | (2016.01) | |

(52) U.S. Cl.
CPC ............. *H01L25/0753* (2013.01); *H01L 33/50* (2013.01); *H01L 2224/32245* (2013.01); *H01L 2224/48091* (2013.01); *H01L 2224/48247* (2013.01); *H01L 2224/73265* (2013.01)

(56) References Cited

U.S. PATENT DOCUMENTS

| Patent No. | Date | Inventor | Page |
|---|---|---|---|
| 4,322,735 A | 3/1982 | Sadamasa et al. | 257/89 |
| 4,500,914 A | 2/1985 | Watanabe et al. | 348/280 |
| 4,946,547 A | 8/1990 | Palmour et al. | 156/643 |
| 4,992,704 A | 2/1991 | Stinson | 315/312 |
| 5,184,114 A | 2/1993 | Brown | 345/83 |
| 5,200,022 A | 4/1993 | Kong et al. | 156/612 |
| 5,278,432 A | 1/1994 | Ignatius et al. | 257/88 |
| RE34,861 E | 2/1995 | Davis et al. | 437/100 |
| 5,453,405 A | 9/1995 | Fan et al. | 438/34 |
| 5,578,998 A | 11/1996 | Kasprowicz | 340/642 |
| 5,643,834 A | 7/1997 | Harada et al. | 438/122 |
| 5,766,987 A | 6/1998 | Mitchell et al. | 438/126 |
| 5,924,785 A | 7/1999 | Zhang et al. | 362/241 |
| 5,946,022 A | 8/1999 | Kamimura | 347/238 |
| 5,990,497 A | 11/1999 | Kamakura et al. | |
| 6,093,940 A | 7/2000 | Ishinaga et al. | 257/99 |
| 6,149,283 A | 11/2000 | Conway et al. | 362/236 |
| 6,153,448 A | 11/2000 | Takahashi | 438/114 |
| 6,224,216 B1 | 5/2001 | Parker et al. | 353/31 |
| 6,297,598 B1 | 10/2001 | Wang et al. | 315/169.3 |
| 6,422,716 B2 | 7/2002 | Henrici et al. | 362/235 |
| 6,452,217 B1 | 9/2002 | Wojnarowski et al. | 257/99 |
| 6,476,410 B2 | 11/2002 | Ishinaga | 257/13 |
| 6,498,355 B1 | 12/2002 | Harrah et al. | 257/99 |
| 6,501,084 B1 | 12/2002 | Sakai et al. | 250/504 R |
| 6,573,537 B1 | 6/2003 | Steigerwald et al. | 257/103 |
| 6,577,073 B2 | 6/2003 | Shimizu et al. | |
| 6,617,795 B2 | 9/2003 | Bruning | 315/151 |
| 6,637,921 B2 | 10/2003 | Coushaine | 362/517 |
| 6,653,765 B1 | 11/2003 | Levinson | |
| 6,661,029 B1 | 12/2003 | Duggal | 257/89 |
| 6,672,741 B1 | 1/2004 | Young | 362/311 |
| 6,722,777 B2 | 4/2004 | Erber | 362/518 |
| 6,739,735 B2 | 5/2004 | Talamo et al. | 362/237 |
| 6,767,112 B2 | 7/2004 | Wu | 362/247 |
| 6,803,732 B2 | 10/2004 | Kraus et al. | 315/307 |
| 6,811,277 B2 | 11/2004 | Amano | 362/31 |
| 6,846,101 B2 | 1/2005 | Coushaine | 362/517 |
| 6,891,200 B2 | 5/2005 | Nagai et al. | 257/88 |
| 6,893,140 B2 | 5/2005 | Storey et al. | 362/191 |
| 6,899,443 B2 | 5/2005 | Rizkin et al. | 362/327 |
| 6,909,123 B2 | 6/2005 | Hayashimoto et al. | 257/98 |
| 6,948,825 B2 | 9/2005 | Christoph | 362/33 |
| 7,001,047 B2 | 2/2006 | Holder et al. | 362/296 |
| 7,002,546 B1 | 2/2006 | Stuppi et al. | 345/102 |
| 7,008,080 B2 | 3/2006 | Bachl et al. | 362/237 |
| 7,015,512 B2 | 3/2006 | Park et al. | 257/99 |
| 7,023,019 B2 | 4/2006 | Maeda et al. | 257/89 |
| 7,029,150 B2 | 4/2006 | Finch | 362/298 |
| 7,055,987 B2 | 6/2006 | Staufert | 362/235 |
| 7,095,053 B2 | 8/2006 | Mazzochette et al. | 257/81 |
| 7,097,334 B2 | 8/2006 | Ishida et al. | 362/516 |
| 7,121,691 B2 | 10/2006 | Coushaine et al. | 362/298 |
| 7,131,760 B2 | 11/2006 | Mayer et al. | 362/555 |
| 7,176,503 B2 | 2/2007 | Kim et al. | 257/100 |
| 7,178,937 B2 | 2/2007 | McDermott | 362/187 |
| 7,204,607 B2 | 4/2007 | Yano et al. | 362/231 |
| 7,213,940 B1 | 5/2007 | Van De Ven et al. | |
| 7,230,280 B2 | 6/2007 | Yaw et al. | 257/98 |
| 7,246,921 B2 | 7/2007 | Jacobson et al. | 362/294 |
| 7,252,408 B2 | 8/2007 | Mazzochette et al. | 362/294 |
| 7,259,400 B1 | 8/2007 | Taskar | 257/96 |
| 7,262,437 B2 | 8/2007 | Bogner et al. | 257/95 |
| 7,270,448 B1 | 9/2007 | Maley, Sr. | 362/334 |
| 7,278,755 B2 | 10/2007 | Inamoto | 362/240 |
| 7,286,296 B2 | 10/2007 | Chaves et al. | 359/641 |
| 7,355,562 B2 | 4/2008 | Schubert et al. | 345/1.3 |
| 7,381,995 B2 | 6/2008 | Tain et al. | |
| 7,387,421 B2 | 6/2008 | Lee et al. | 362/612 |
| 7,439,549 B2 | 10/2008 | Marchl et al. | 257/88 |
| 7,478,922 B2 | 1/2009 | Garbus, Jr. | 362/231 |
| 7,528,421 B2 | 5/2009 | Mazzochette | 257/99 |
| 7,605,452 B2 | 10/2009 | Yamanaka et al. | 257/676 |
| 7,621,655 B2 | 11/2009 | Roberts et al. | 362/249.02 |
| 7,665,861 B2 | 2/2010 | Blumel et al. | 362/249.02 |
| 7,700,964 B2 | 4/2010 | Morimoto et al. | 257/98 |
| 7,723,744 B2 | 5/2010 | Gillies et al. | 257/98 |
| 7,772,609 B2 | 8/2010 | Yan | |
| 7,821,023 B2 | 10/2010 | Yuan et al. | 257/98 |
| 7,829,899 B2 | 11/2010 | Hutchins | 257/79 |
| 7,897,980 B2 | 3/2011 | Yuan et al. | 257/88 |
| 7,902,560 B2 | 3/2011 | Bierhuizen et al. | 257/82 |
| 8,022,626 B2 | 9/2011 | Hamby et al. | 313/512 |
| 8,035,603 B2 | 10/2011 | Furukawa et al. | 345/102 |
| 8,098,364 B2 | 1/2012 | Yu et al. | 355/55 |
| 8,272,757 B1 | 9/2012 | Fan et al. | 362/231 |
| 8,511,855 B2 | 8/2013 | Marchl et al. | |
| 2001/0032985 A1 | 10/2001 | Bhat | 257/88 |
| 2001/0033726 A1 | 10/2001 | Shie et al. | 385/133 |
| 2002/0001193 A1 | 1/2002 | Osawa et al. | |
| 2002/0001869 A1 | 1/2002 | Fjelstad | |
| 2002/0029071 A1 | 3/2002 | Whitehurst | 607/88 |
| 2002/0070681 A1* | 6/2002 | Shimizu et al. | 315/246 |
| 2002/0093820 A1 | 7/2002 | Pederson | |
| 2002/0113246 A1 | 8/2002 | Nagai et al. | |
| 2002/0136025 A1 | 9/2002 | Zhang | |
| 2002/0153529 A1 | 10/2002 | Shie | 257/99 |
| 2002/0171089 A1 | 11/2002 | Okuyama et al. | 257/88 |
| 2002/0171090 A1 | 11/2002 | Oohata et al. | 257/88 |
| 2003/0053310 A1 | 3/2003 | Sommers et al. | |
| 2003/0058641 A1 | 3/2003 | Watanabe et al. | |
| 2003/0063475 A1 | 4/2003 | Simmons | |
| 2003/0072153 A1 | 4/2003 | Matsui et al. | |
| 2003/0116769 A1 | 6/2003 | Song et al. | |
| 2003/0142712 A1 | 7/2003 | Ikeda et al. | 372/36 |
| 2003/0147055 A1 | 8/2003 | Yokoyama | |
| 2003/0171150 A1 | 9/2003 | Oki et al. | 463/51 |
| 2003/0189829 A1 | 10/2003 | Shimizu et al. | 362/240 |
| 2004/0026706 A1 | 2/2004 | Bogner et al. | 257/99 |
| 2004/0037076 A1 | 2/2004 | Katoh | 362/235 |
| 2004/0099874 A1 | 5/2004 | Chang et al. | 257/98 |
| 2004/0104391 A1 | 6/2004 | Maeda et al. | 257/79 |
| 2004/0135522 A1 | 7/2004 | Berman et al. | |
| 2004/0155565 A1 | 8/2004 | Holder et al. | |
| 2004/0184272 A1 | 9/2004 | Wright et al. | 362/373 |
| 2004/0222433 A1 | 11/2004 | Mazzochette et al. | |
| 2004/0239242 A1 | 12/2004 | Mano et al. | |
| 2004/0245532 A1 | 12/2004 | Maeda et al. | 257/89 |
| 2004/0256626 A1 | 12/2004 | Wang | |
| 2004/0264193 A1 | 12/2004 | Okumura | |
| 2005/0057929 A1 | 3/2005 | Yano et al. | 362/240 |
| 2005/0073840 A1 | 4/2005 | Chou et al. | |
| 2005/0082475 A1 | 4/2005 | Doan | 250/307 |
| 2005/0093422 A1 | 5/2005 | Wang | |
| 2005/0093430 A1 | 5/2005 | Ibbetson et al. | 313/501 |
| 2005/0122018 A1 | 6/2005 | Morris | 313/46 |

(56) References Cited

U.S. PATENT DOCUMENTS

| | | | |
|---|---|---|---|
| 2005/0122031 A1 | 6/2005 | Itai et al. | |
| 2005/0141584 A1 | 6/2005 | Ohe et al. | 372/108 |
| 2005/0179041 A1 | 8/2005 | Harbers et al. | 257/80 |
| 2005/0225976 A1 | 10/2005 | Zampini et al. | |
| 2005/0253151 A1 | 11/2005 | Sakai et al. | 257/79 |
| 2005/0276053 A1 | 12/2005 | Nortrup et al. | 362/294 |
| 2006/0006406 A1 | 1/2006 | Kim et al. | 257/100 |
| 2006/0017402 A1 | 1/2006 | McKinney et al. | |
| 2006/0039143 A1 | 2/2006 | Katoh et al. | 362/244 |
| 2006/0043406 A1 | 3/2006 | Tsubokura et al. | 257/99 |
| 2006/0049782 A1 | 3/2006 | Vornsand et al. | |
| 2006/0102914 A1 | 5/2006 | Smits et al. | 257/98 |
| 2006/0105478 A1 | 5/2006 | Camras et al. | 438/22 |
| 2006/0105484 A1 | 5/2006 | Basin et al. | |
| 2006/0139580 A1 | 6/2006 | Conner | 353/98 |
| 2006/0157721 A1 | 7/2006 | Tran et al. | |
| 2006/0163589 A1 | 7/2006 | Fan et al. | 257/88 |
| 2006/0180818 A1 | 8/2006 | Nagai et al. | |
| 2006/0231852 A1 | 10/2006 | Kususe et al. | 257/99 |
| 2006/0258028 A1 | 11/2006 | Paolini et al. | 438/22 |
| 2006/0262524 A1 | 11/2006 | Kah, Jr. | |
| 2006/0289878 A1 | 12/2006 | Brunner et al. | 257/89 |
| 2007/0013057 A1 | 1/2007 | Mazzochette | 257/723 |
| 2007/0030676 A1 | 2/2007 | Ichihara et al. | |
| 2007/0046176 A1 | 3/2007 | Bukesov et al. | 313/496 |
| 2007/0109779 A1 | 5/2007 | Sekiguchi et al. | |
| 2007/0115670 A1 | 5/2007 | Roberts et al. | |
| 2007/0139920 A1 | 6/2007 | Van De Ven et al. | 362/235 |
| 2007/0158668 A1 | 7/2007 | Tarsa | 257/79 |
| 2007/0189017 A1 | 8/2007 | Hofmann | |
| 2007/0223219 A1 | 9/2007 | Medendorp, Jr. et al. | |
| 2007/0247414 A1* | 10/2007 | Roberts | 345/102 |
| 2007/0247855 A1 | 10/2007 | Yano | |
| 2007/0252924 A1 | 11/2007 | Haga et al. | 349/68 |
| 2007/0267983 A1 | 11/2007 | Van De Ven et al. | |
| 2007/0278503 A1 | 12/2007 | Van De Ven et al. | |
| 2007/0278934 A1 | 12/2007 | Van De Ven et al. | |
| 2007/0279903 A1 | 12/2007 | Negley et al. | |
| 2007/0291467 A1 | 12/2007 | Nagai et al. | 362/84 |
| 2007/0295972 A1 | 12/2007 | Tsai et al. | 257/88 |
| 2007/0295975 A1 | 12/2007 | Omae | 257/89 |
| 2008/0024696 A1 | 1/2008 | Arai et al. | 349/62 |
| 2008/0074885 A1 | 3/2008 | Brands et al. | |
| 2008/0084685 A1 | 4/2008 | Van De Ven et al. | |
| 2008/0084701 A1 | 4/2008 | Van De Ven et al. | |
| 2008/0100774 A1 | 5/2008 | Jeon et al. | 349/62 |
| 2008/0106895 A1* | 5/2008 | Van De Ven et al. | 362/231 |
| 2008/0106907 A1 | 5/2008 | Trott et al. | |
| 2008/0112164 A1 | 5/2008 | Teshirogi | 362/231 |
| 2008/0112168 A1 | 5/2008 | Pickard et al. | |
| 2008/0128735 A1 | 6/2008 | Yoo | |
| 2008/0130285 A1 | 6/2008 | Negley et al. | |
| 2008/0137357 A1 | 6/2008 | Friedrichs et al. | 362/507 |
| 2008/0142816 A1 | 6/2008 | Bierhuizen et al. | 257/82 |
| 2008/0151527 A1 | 6/2008 | Ueno | |
| 2008/0170396 A1 | 7/2008 | Yuan et al. | 362/244 |
| 2008/0173884 A1 | 7/2008 | Chitnis | 438/22 |
| 2008/0179611 A1 | 7/2008 | Chitnis | 257/98 |
| 2008/0186702 A1 | 8/2008 | Camras et al. | 362/231 |
| 2008/0203415 A1 | 8/2008 | Thompson et al. | |
| 2008/0204366 A1 | 8/2008 | Kane et al. | 345/44 |
| 2008/0225520 A1 | 9/2008 | Garbus | 362/231 |
| 2008/0232079 A1 | 9/2008 | Awazu | 362/231 |
| 2008/0238335 A1 | 10/2008 | Lee et al. | |
| 2008/0239722 A1 | 10/2008 | Wilcox | 362/268 |
| 2008/0278655 A1 | 11/2008 | Moon | 349/58 |
| 2008/0285268 A1 | 11/2008 | Oku et al. | 362/231 |
| 2009/0008662 A1 | 1/2009 | Ashdown et al. | |
| 2009/0050907 A1 | 2/2009 | Yuan et al. | 257/88 |
| 2009/0050908 A1 | 2/2009 | Yuan | 257/88 |
| 2009/0108281 A1 | 4/2009 | Keller et al. | 257/98 |
| 2009/0160363 A1 | 6/2009 | Negley et al. | |
| 2009/0195189 A1 | 8/2009 | Zampini et al. | |
| 2009/0201679 A1 | 8/2009 | Konaka | 362/235 |
| 2009/0212717 A1 | 8/2009 | Trattler | 315/297 |
| 2009/0231832 A1 | 9/2009 | Zukauskas et al. | 362/84 |
| 2009/0257240 A1 | 10/2009 | Koike | 362/538 |
| 2009/0316073 A1 | 12/2009 | Chen et al. | 349/64 |
| 2010/0025700 A1* | 2/2010 | Jung et al. | 257/89 |
| 2010/0046231 A1 | 2/2010 | Medinis | 362/294 |
| 2010/0079059 A1 | 4/2010 | Roberts et al. | |
| 2010/0103660 A1 | 4/2010 | Van De Ven | 362/231 |
| 2010/0149783 A1 | 6/2010 | Takenaka et al. | 362/84 |
| 2010/0302786 A1 | 12/2010 | Wilcox | 362/327 |
| 2011/0001149 A1 | 1/2011 | Chan et al. | |
| 2011/0075428 A1 | 3/2011 | Chen | 362/311.02 |
| 2011/0095311 A1 | 4/2011 | Marchl et al. | |
| 2011/0164425 A1 | 7/2011 | Chen | 362/311.06 |
| 2011/0222280 A1 | 9/2011 | Kim | 362/235 |
| 2012/0075858 A1 | 3/2012 | Hsieh | 362/249.02 |
| 2012/0134154 A1 | 5/2012 | Marchl et al. | |

FOREIGN PATENT DOCUMENTS

| | | |
|---|---|---|
| CN | 1470072 | 1/2004 |
| CN | 1470072 A | 1/2004 |
| CN | 1512601 A | 7/2004 |
| CN | 1641899 A | 7/2005 |
| CN | 1667845 A | 9/2005 |
| CN | 101253813 | 8/2006 |
| CN | 1910762 A | 2/2007 |
| CN | 1983590 A | 6/2007 |
| CN | 1983590 A | 6/2007 |
| CN | 101217840 | 7/2008 |
| CN | 201119078 | 9/2008 |
| CN | 101288341 | 10/2008 |
| CN | 101271674 | 12/2010 |
| DE | 2315709 | 3/1973 |
| DE | 19848078 | 4/2000 |
| DE | 102005059362 | 9/2006 |
| DE | 102005028403 | 12/2006 |
| EP | 2337072 A2 | 6/2011 |
| EP | 2341280 A2 | 7/2011 |
| JP | 6284942 | 5/1987 |
| JP | 03209781 | 9/1991 |
| JP | 0545812 | 6/1993 |
| JP | 09246602 | 9/1997 |
| JP | 10012915 | 1/1998 |
| JP | 10261821 | 9/1998 |
| JP | 2001000043 | 1/2001 |
| JP | 2001057446 | 2/2001 |
| JP | 2001351404 | 12/2001 |
| JP | 2002184207 | 6/2002 |
| JP | 2002184207 A | 6/2002 |
| JP | 2003-168305 | 6/2003 |
| JP | 2003168305 | 6/2003 |
| JP | 2003168305 A | 6/2003 |
| JP | 2004512687 | 4/2004 |
| JP | 2004266168 | 9/2004 |
| JP | 2005142311 | 6/2005 |
| JP | 2005158957 | 6/2005 |
| JP | 2005-228695 | 8/2005 |
| JP | 2005228695 | 8/2005 |
| JP | 2005228695 A | 8/2005 |
| JP | 2006019598 | 1/2006 |
| JP | 2006054329 | 2/2006 |
| JP | 2006054329 A | 2/2006 |
| JP | 2006115854 | 4/2006 |
| JP | 2006-128512 | 5/2006 |
| JP | 2006128512 | 5/2006 |
| JP | 2006173271 | 6/2006 |
| JP | 2006261039 | 9/2006 |
| JP | 2006261375 | 9/2006 |
| JP | 2006294898 | 10/2006 |
| JP | 2006344690 | 12/2006 |
| JP | 2007049172 | 2/2007 |
| JP | 200759260 | 3/2007 |
| JP | 2007059207 | 3/2007 |
| JP | 2007067103 | 3/2007 |
| JP | 2007112134 | 5/2007 |
| JP | 2007189239 | 7/2007 |
| JP | 2007519221 | 7/2007 |
| JP | 2007227679 | 9/2007 |
| JP | 2007251214 | 9/2007 |

(56) References Cited

FOREIGN PATENT DOCUMENTS

| | | |
|---|---|---|
| JP | 2007529105 | 10/2007 |
| JP | 2007324608 | 12/2007 |
| JP | 200810591 | 1/2008 |
| JP | 200828171 | 2/2008 |
| JP | 2008505433 | 2/2008 |
| JP | 2008123818 | 5/2008 |
| JP | 2008218486 | 9/2008 |
| JP | 2008252262 | 10/2008 |
| JP | 2010511978 | 4/2010 |
| JP | 2011521469 | 7/2011 |
| TW | 540163 | 1/2003 |
| TW | 540163 B | 7/2003 |
| TW | 2004095580 | 3/2004 |
| TW | 200525775 | 8/2005 |
| TW | 200633265 | 9/2006 |
| TW | 200620718 | 10/2007 |
| TW | 200827618 | 7/2008 |
| TW | 1404226 | 8/2013 |
| WO | WO02097884 A1 | 5/2002 |
| WO | WO 02/097884 | 12/2002 |
| WO | WO03019072 | 3/2003 |
| WO | WO03019072 | 6/2003 |
| WO | WO2005013365 A2 | 2/2005 |
| WO | WO 2005013365 A2 | 2/2005 |
| WO | WO 2006/001221 A1 | 1/2006 |
| WO | WO2006001221 | 1/2006 |
| WO | WO2006013800 | 2/2006 |
| WO | WO2006016326 | 2/2006 |
| WO | WO2006/068297 | 6/2006 |
| WO | WO2006068297 | 6/2006 |
| WO | WO2006068297 A1 | 6/2006 |
| WO | WO2006111805 | 10/2006 |
| WO | WO2006135005 | 12/2006 |
| WO | WO2007055455 | 5/2007 |
| WO | WO2007121486 A2 | 10/2007 |
| WO | WO2007126720 A2 | 11/2007 |
| WO | WO 2009/157999 A1 | 12/2009 |
| WO | WO2010133772 | 11/2010 |

OTHER PUBLICATIONS

Communication pursuant to Article 94(3) EPC, from Application No. 09 758 647.3-1226, dated Jun. 21, 2011.
Cree EZ700 EZBright LED chip data sheet, 2006, pp. 1-6.
Cree EZ1000 EZBright LED chip data sheet, 2006, pp. 1-6.
Cree XLamp XR-E and XR-C LED data sheet, 2007, pp. 1-11.
Lamina, Titan Turbo LED Light Engines data sheet, 2008.
U.S. Appl. No. 61/041,404, "Solid State Lighting Devices and Methods of Manufacturing Same".
U.S. Appl. No. 60/130,411, "Light Source With Near Field Mixing".
U.S. Appl. No. 61/037,365.
Office Action for U.S. Appl. No. 12/883,979, mailed on Sep. 12, 2011.
Response to Office Action Sep. 12, 2011, U.S. Appl No. 12/883,979, filed Feb. 7, 2012.
Notice of Allowance from U.S. Appl. No. 12/883,979, mailed Mar. 19, 2012.
Office Action for U.S. Appl. No. 12/156,995, mailed on Aug. 30, 2011.
Response to Office Action mailed Aug. 30, 2011, U.S. Appl. No. 12/156,995, filed Nov. 29, 2011.
Office Action for U.S. Appl. No. 12/288,957, mailed Oct. 18, 2011.
Response to Office Action mailed Oct. 18, 2011, U.S. Appl. No. 12/288,957, filed Dec. 19, 2011.
Advisory Action for U.S. Appl. No. 12/288,957, mailed Jan. 11, 2012.
Response to Advisory Action U.S. Appl. No. 12/288,957, filed Feb. 15, 2012.
Office Action for U.S. Appl. No. 11/982,276, mailed Feb. 22, 2012.
International Search Report and Written Opinion from PCT Application No. PCT/US2010/003190 Mailed Apr. 6, 2011.
International Search Report and Written Opinion for counterpart PCT Application No. PCT/US2010/003168 mailed Apr. 26, 2011.
Office Action from patent U.S. Appl. No. 12/288.957, dated: Sep. 21, 2010.
Response to Office Action from U.S. Appl. No. 12/288,957, filed: Dec. 21, 2010.
Office Action from patent U.S. Appl. No. 12/629,735, dated: Sep. 22, 2010.
Response to Office Action from U.S. Appl. No. 12/629,735, filed: Dec. 22, 2010.
Office Action from U.S. Appl. No. 12/288,957, dated: Mar. 9, 2011.
Office Action from U.S. Appl. No. 12/629,735, dated: Mar. 10, 2011.
Office Action from U.S. Appl. No. 12/156,995, dated: Mar. 10, 2010.
Response to Office Action from patent U.S. Appl. No. 12/156,995, filed: Sep. 10, 2010.
Office Action from U.S. Appl. No. 12/156,995, dated Nov. 17, 2010.
Response to Office Action from U.S. Appl. No. 12/156,995, filed: Apr. 18, 2011.
International Search Report and Written Opinion from PCT/US2011/001200, dated Apr. 27, 2012.
First Office Action for Chinese Patent Application No. 201230001815.3, dated Apr. 11, 2012.
Summary of Notice of Reasons for Rejection from Japanese Patent Application No. 2007-228699, dated May 8, 2012.
Summary of Reasons for Rejection for Japanese Patent Application No. 2007-228699 mailed May 10, 2011.
Notice of Reasons for Rejection from Japanese Patent Application No. 2008-221738, dated May 29, 2012.
First Office Action for Chinese Patent Application No. 200980125244.X, dated May 28, 2012.
Notice of Reasons for Rejection in Japanese Patent Application No. 2011-512442, dated Aug. 7, 2012.
Reason for Rejection for Japanese Patent Application No. 2011-510484, dated Aug. 7, 2012.
First Office Action from Chinese Patent Application 200980142352.8, dated Aug. 27, 2012 (received Nov. 2, 2012).
Search Report from Chinese Patent Application No. 200980125244.X, dated Nov. 5, 2012.
Second Office Action from Chinese Patent Application No. 200980125244.X, dated Nov. 26, 2012.
PCT Preliminary Report and Written Opinion from PCT Appl. No. PCT/US2011/001200, dated Jan. 17, 2013.
Notice of Reasons for Rejection from Japanese Patent Application No. 2011-533175, dated Apr. 2, 2013.
Decision of Rejection from Japanese Patent Application No. 2008-221738, dated Feb. 26, 2013.
Decision of Dismissal of Amendment from Japanese Patent Application No. 2008-221738, dated Feb. 26, 2013.
Office Action from Japanese Patent Application No. 2011-512442, dated Feb. 22, 2013.
Satoshi Emotes, "How to make Mobile", [on line]. May 30, 2001, ITmedia (searched on Feb. 15, 2013), Internet URL:http//www.itmedia.co.jp/mobile/rensai/howtomake/04.
Office Action from Japanese Patent Appl. No. 2007-228699, dated Mar. 6, 2013.
Second Office Action from Chinese Patent Application No. 200980142352.8, dated May 6, 2013.
Third Office Action from Chinese Patent Application No. 200980125244.X, dated May 31, 2013.
Office Action from U.S. Appl. No 12/156,995, dated Apr. 12, 2012.
Office Action from U.S. Appl. No. 11/982,276, dated Aug. 7, 2012.
Response to OA from U.S. Appl. No. 12/156,995, filed Sep. 12, 2012.
Response to OA from U.S. Appl. No. 11/982,276, filed Sep. 25, 2012.
Office Action from U.S. Appl. No. 11/982,276, dated Oct. 10, 2012.
Office Action from U.S. Appl. No. 13/489,035, dated Jan. 22, 2013.
Office Action from U.S. Appl. No. 12/862,640, dated Jan. 24, 2013.
Office Action from U.S. Appl. No. 13/029,005, dated Jan. 24, 2013.
Response to OA from U.S. Appl. No. 11/982,276, filed Oct. 31, 2012.
Response to OA from U.S. Appl. No. 13/489,035, filed Jun. 5, 2013.
Response to OA from U.S. Appl. No. 12/862,640, filed Apr. 17, 2013.
Response to OA from U.S. Appl. No. 13/029,005, filed Apr. 17, 2013.
Office Action from U.S. Appl. No. 13/177,415, dated Jan. 25, 2013.
Office Action from U.S. Appl. No. 12/629,735, dated Feb. 8, 2013.

(56) References Cited

OTHER PUBLICATIONS

Office Action from U.S. Appl. No. 12/544,131, dated Jan. 15, 2013.
Office Action from U.S. Appl. No. 12/643,705, dated Jun. 13, 2012.
Response to OA from U.S. Appl. No. 13/177,415, filed Apr. 23, 2013.
Response to OA from U.S. Appl. No. 12/629,735, filed Jun. 10, 2013.
Response to Oa from U.S. Appl. No. 12/544,131, filed Mar. 13, 2013.
Response to OA from U.S. Appl. No. 12/643,705, filed Sep. 10, 2012.
Office Action from Patent Application No. 11/982,276, dated May 29, 2013.
Office Action from Patent Application No. 12/862,640, dated Apr. 30, 2013.
Office Action from U.S. Appl. No. 12/288,957, dated Mar. 26, 2013.
Office Action from U.S Appl. No. 13/177,415, dated May 2, 2013.
Response to OA from U.S. Appl. No. 12/288,957, filed Jun. 21, 2013.
Office Action from Japanese Patent Appl. No. 2011-533175, dated Jul. 25, 2013.
Notice of Reconsideration from Japanese Patent Appl. No. 2008-221738, dated Jul. 9, 2013.
International Search Report and Written Opinion for Appl. No. PCT/US2013/038391, dated Aug. 8, 2013.
Interrogation from Japanese Patent Appl. No. 2008-221738, dated Sep. 10, 2013.
First Office Action from Chinese Patent Appl. No. 200980125251, dated Aug. 8, 2013 (Received Oct. 4, 2013).
Search Report from Chinese Patent Appl. No. 200980125251, dated Jul. 31, 2013 (Received Oct. 14, 2013).
Office Action from U.S. Appl. No. 12/629,735, dated Sep. 18, 2013.
Office Action from U.S. Appl. No. 13/489,035, dated Aug. 5, 2013.
Response to OA from U.S. Appl. No. 13/489,035, filed Oct. 7, 2013.
Office Action from U.S. Appl. No. 12/156,995, dated Aug. 28, 2013.
Office Action from U.S. Appl. No. 12/288,957, dated Sep. 13, 2013.
Office Action from U.S. Appl. No. 13/177,415, dated Oct. 7, 2013.
Notice of Reasons for Rejection from Japanese Patent Appl. No. 2012-544480, dated Oct. 29, 2013.
Office Action from U.S. Appl. No. 11/982,276, dated Oct. 25, 2013.
Office Action from U.S. Appl. No. 13/971,547, dated Nov. 6, 2013.
Examination Report from European Patent Appl. No. 10 757 645.6-1802, dated Jun. 28, 2013.
Decision of Rejection and Decision of Declining Amendment from Japanese Patent appl. No. 2011-512442, dated Jun. 19, 2013.
Third Office Action and Search Report from Chinese Patent Appl. No. 2009801142352.8, dated Nov. 26, 2013.
Office Action from U.S. Appl. No. 12/156,995, dated May 7, 2014.
Office Action from U.S. Appl. No. 13/177,415, dated May 7, 2014.
Office Action from U.S. Appl. No. 13/971,547, dated May 8, 2014.
Response to Office Action from U.S. Appl. No. 13/971,547, dated Jul. 11, 2014.
Office Action from Taiwanese Patent Appl. No. 098136067, dated Jun. 26, 2014.
Office Action from Taiwanese Patent Appl. No. 098109589, dated Jul. 11, 2014.
Office Action from Japanese Patent Appl. No. 2008-221738 dated Apr. 8, 2014.
Second Office Action from Chinese Patent Appl No. 200980125251.X dated Apr. 3, 2014.
Office Action from Japanese Patent Appl. No. 2011-533175 dated Apr. 28, 2014.
Decision of Rejection from Chinese Patent Application No. 200980125244.X, dated Jan. 13, 2014.
Office Action from Japanese Patent Appl. No. 2013-064671, dated Feb. 3, 2014.
Appeal Board's Questioning from Japanese Patent Appl. No. 2011-512442, dated Jan. 17, 2014.
Extended European Search Report from European Patent Appl. No. 13197857.9, dated Feb. 7, 2014.
European Search Report from European Patent Appl. No. 10757645.6, dated Feb. 2, 2014.
Decision of Rejection from Japanese Patent Appl. No. 2007-228699, dated Mar. 18, 2014.
European Search Report from European Patent appl. No. 08252829.0, dated Feb. 28, 2014.
Office Action from Taiwanese Patent appl. No. 098109589, dated Feb. 18, 2014.
European Examination from European Patent appl. No. 11748482.4-1757, dated Feb. 21, 2014.
Office Action from Patent Application No. 12/156,995, dated Jan. 24, 2014.
Fourth Office Action from Chinese Patent Appl. No. 2009801423528, dated May 29, 2014.
Office Action from U.S. Appl. No. 12/156,995, dated Dec. 8, 2014.
Office Action from U.S. Appl. No. 12/629,735, dated Dec. 18, 2014.
Office Action from U.S. Appl. No. 13/833,272, dated Dec. 31, 2014.
Office Action from U.S. Appl. No. 13/177,415, dated Jan. 8, 2015.
Office Action from U.S. Appl. No. 12/288,957, dated Feb. 5, 2015.
Office Action and Search Report from Taiwanese Patent Appl. No. 098109421, dated Aug. 22, 2014.
Notice of Reasons for Rejection from Japanese Patent Appl. No. 2012-544480, dated Aug. 5, 2014.
Office Action from U.S. Appl. No. 12/288,957, dated Aug. 12, 2014.
Fifth Office Action from Chinese Appl. No. 2009801423528, dated Dec. 31, 2014.
Second Office Action from Chinese Appl. No. 201080062056.9, dated Dec. 31, 2014.
Third Office Action from Chinese Appl. No. 200980125251.X, dated Oct. 31, 2014.
Pretrial Report from Japanese Appl. No. 2011-533175, dated Oct. 8, 2014.
Office Action from Taiwanese Patent Appl. No. 099105210, dated Oct. 20, 2014.
Reexamination Report from Japanese Appl. No. 2007-228699, dated Nov. 7, 2014.
Appeal Decision from Japanese Appl. No. 2013-12017, dated Nov. 25, 2014.
Reasons for Rejection from Japanese Appl. No. 2013-064671, dated Nov. 18, 2014.
International Preliminary Report from Appl. No. PCT/US2013/038391, dated Nov. 25, 2014.
Office Action from U.S. Appl. No. 12/156,995, dated Sep. 26, 2014.
Response to OA from U.S. Appl. No. 12/156,995, filed Nov. 19, 2014.
Office Action from U.S. Appl. No. 11/982,276, dated Oct. 23, 2014.
Office Action from U.S. Appl. No. 12/288,957, dated Nov. 19, 2014.
Office Action from Korean Appl. No. 10-2011-7000240, dated Feb. 17, 2015.
Office Action from Taiwanese Appl. No. 098136067, dated Jan. 21, 2015.
First Office Action and Search Report from Chinese Appl. No. 2011800428038, dated Jan. 21, 2015.
First Office Action from Chinese Patent Appl. No. 201210492856.6, dated Jan. 5, 2015.
Notification of Reexamination from Chinese Patent Appl. No. 200980125244X, dated Mar. 2, 2015.
Office Action from Korean Patent Appl. No. 10-2010-7028850, dated Feb. 17, 2015.
Office Action from Taiwanese Patent Appl. No. 099145035, dated Apr. 24, 2015.
Office Action from Japanese Patent Appl. No. 2011-533175, dated Apr. 28, 2015.
Summons to attend oral hearing from European Appl. No. 10757645.6-1802, dated Apr. 30, 2015.
Office Action from Japanese Appl. No. 2013-064671, dated Jun. 2, 2015.
Office Action from Taiwanese Appl. No. 098109421, dated Apr. 22, 2015.
Decision of Rejection and Non Acceptance of Amendment from Japanese Patent Appl. No. 2012-544480, dated May 12, 2015.
Office Action from U.S. Appl. No. 11/982,276, dated Apr. 16, 2015.
Office Action from U.S. Appl. No. 12/156,995, dated May 5, 2015.
Final Notice for Reasons for Rejection from Japanese Patent appl. No. 2013-064671, dated Jun. 2, 2015 (translations).
Decision of Rejection from Chinese Patent Appl. No. 200980142352.8, dated Jul. 14, 2015.

(56) References Cited

OTHER PUBLICATIONS

Office Action from U.S. Appl. No. 13/177,415, dated Jun. 18, 2015.
Response to OA from U.S. Appl. No. 13/177,415, filed Aug. 17, 2015.
Office Action from U.S. Appl. No. 12/629,735, dated Jul. 15, 2015.
Office Action from U.S. Appl. No. 12/288,957, dated Jul. 30, 2015.
Office Action from U.S. Appl. No. 12/156,995, dated Sep. 4, 2015.
Office Action from U.S. Appl. No. 13/833,272, dated Sep. 24, 2015.
Office Action from U.S. Appl. No. 13/177,415, dated Oct. 16, 2015.
Notification of Reexamination from Chinese Patent Appl. No. 200980125244X, dated Oct. 15, 2015.
Notification of Filing Receipt (Reexamination) from Chinese Patent Appl. No. 200980142352.8, dated Nov. 10, 2015.
Trial Decision from Japanese Patent Appl. No. 2011-533175, dated Oct. 27, 2015.
Decision to Refuse a European Patent Application. European Patent Appl. No. 10757645.6, dated Oct. 27, 2015.
Decision of Reexamination from Chinese Patent Appl. No. 200980142352.8, dated Dec. 2, 2015.
Decision of Rejection from Japanese Patent Appl. No. 2013-064671, dated Dec. 28. 2015.
Examination Report from European Patent appl No. 11 748 482.4-1757, dated Nov. 16, 2015.

\* cited by examiner

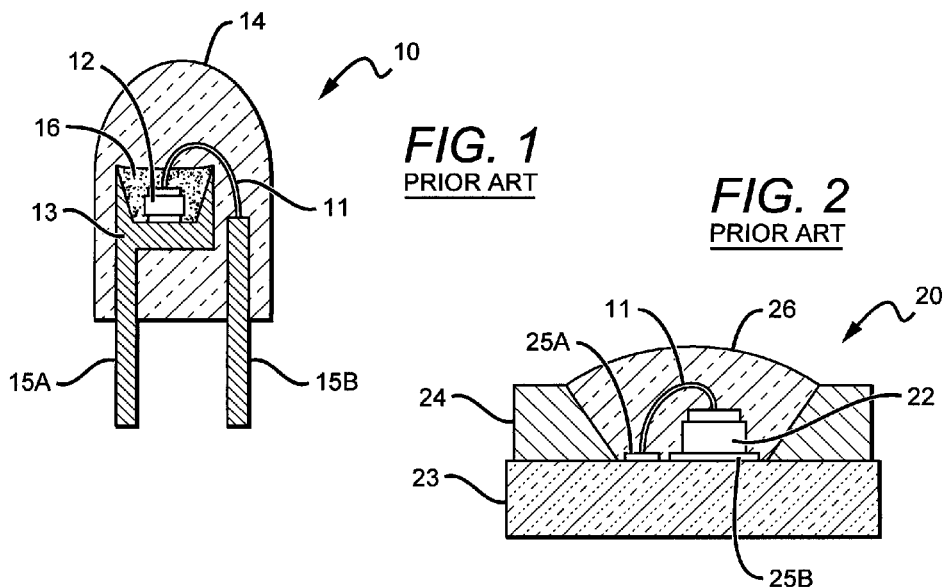
*FIG. 1*
PRIOR ART
*FIG. 2*
PRIOR ART
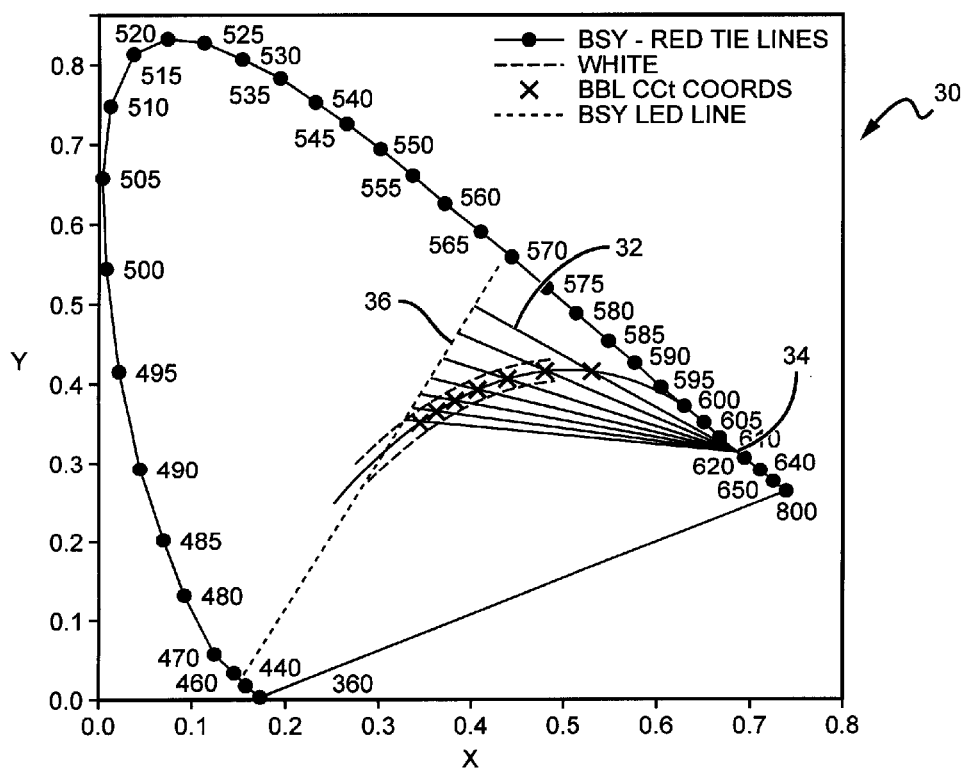
*FIG. 3*

SATURATED YELLOW PHOSPHOR CONVERTED LED AND BLUE CONVERTED RED LED

CROSS REFERENCE TO RELATED APPLICATIONS

This application is a continuation-in-part of and claims the benefit of U.S. patent application Ser. No. 12/491,654, filed Jun. 25, 2009 now U.S. Pat. No. 8,998,444, entitled "Solid State Lighting Devices Including Light Mixtures", which claims the benefit of and priority to U.S. Provisional Patent Application No. 61/075,513, filed Jun. 25, 2008, entitled "Solid State Lighting Method." U.S. patent application Ser. No. 12/491,654 is also a continuation-in-part of U.S. patent application Ser. No. 11/736,761 now U.S. Pat. No. 8,513,875, filed Apr. 18, 2007, entitled "Lighting Devices and Lighting Method," which claims the benefit of U.S. Provisional Application No. 60/792,859, filed Apr. 18, 2006, entitled "Lighting and Lighting Method," U.S. Provisional Patent Application No. 60/793,524, filed on Apr. 20, 2006, entitled "Lighting Device and Lighting Method," and U.S. Provisional Application No. 60/868,134, filed Dec. 1, 2006, entitled "Lighting Device and Lighting Method." U.S. patent application Ser. No. 12/491,654 is also a continuation-in-part of U.S. patent application Ser. No. 11/948,021, filed Nov. 30, 2007 now U.S. Pat. No. 9,084,328, entitled "Lighting Device and Lighting Method," which claims the benefit of U.S. Provisional Patent Application No. 60/868,134, filed on Dec. 1, 2006, entitled "Lighting Device and Lighting Method."

BACKGROUND OF THE INVENTION

1. Field of the Invention

This invention relates to solid state lighting (SSL) and in particular to SSL luminaires having a plurality of LED chips or LED packages whose emission combines to produce light with the desired characteristics.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup due to the less than 100% reflectivity of practical reflector surfaces). In addition, heat retention may be an issue for a package such as the package 10 shown in FIG. 1, since it may be difficult to extract heat through the leads 15A, 15B.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LEDs and LED packages, such as those shown in FIGS. 1 and 2, are more commonly being used for lighting applications that were previously the domain of incandescent or fluorescent lighting. The LEDs and LED packages can be arranged as the light source in SSL luminaries or lamps and single or multiple LEDs or LED packages can be used. The general acceptance of these luminaries has accelerated with the improvement in LED emission efficiency and quality. LEDs have been demonstrated that can produce white light with an efficiency of greater than 150 L/W, and LEDs are expected to be the predominant commercially utilized lighting devices within the next decade.

The light generated by different light sources can be measured in terms of color rendering index (CRI or CRI Ra) and color temperature. CRI is a quantitative measurement of the ability of a light source to reproduce the colors of various objects faithfully in comparison with an ideal or natural light source. Light sources with a high CRI approaching 100 can be desirable in color-critical applications such as photography and cinematography. Daylight has a high CRI of approximately 100 and incandescent bulbs have a relatively close CRI of greater than 95. By comparison, fluorescent lighting has a lower CRI in the range of 70-80, and mercury vapor or sodium lamps have a much lower CRI of 40 or less. High quality light suitable for general indoor illumination should have a CRI of greater than 90.

Color temperature is a characteristic of light source that is determined by comparing the light's chromaticity with that of an ideal black-body radiator. The temperature (usually measured in kelvins (K)) at which the heated black-body radiator matches the color produced by the light source is that source's color temperature. For incandescent light sources the light is of thermal origin and is very close to that of an ideal black-body radiator. Higher color temperatures of 5000 K or more are "cool" and have green to blue colors while lower color temperatures of 2700 to 3500 K are considered "warm" and have yellow to red colors. General illumination can have a color temperature between 2,000 and 10,000 K, with the majority of general lighting devices being between 2,700 and 6,500 K.

In contrast to incandescent radiation, light sources, such as fluorescent lamps emit light primarily by processes other than raising the temperature of a body. This means the emitted radiation does not follow the form of a black-body spectrum and these sources are assigned what is known as a correlated color temperature (CCT). CCT is the color temperature of a black body radiator which to human color perception most closely matches the light from the lamp. For high quality light sources it is also important that color of the illumination be as close as possible to that of a black body spectrum (i.e. black body locus on CIE chromaticity diagram). On such standard deviation is measured in terms of a MacAdam ellipses with a suitable proximity to the black body locus typically being within a 4-step MacAdam ellipse.

SSL luminaires have been developed that utilize a plurality of LED chips or LED packages, with at least some being coated by a conversion material so that the combination of all the LED chips or packages produces the desired wavelength of white light. Some of these include blue emitting LEDs covered by a conversion material such as YAG:CE or Bose, and blue or UV LEDs covered by RGB phosphors. These have resulted in luminaires with generally good efficacy, but only medium CRI. These have not been able to demonstrate both the desirable high CRI and high efficacy, especially with color temperatures between 2700 K and 4000 K.

Techniques for generating white light from a plurality of discrete light sources to provide improved CRI at the desired color temperature have been developed that utilize different hues from different discrete light sources. Such techniques are described in U.S. Pat. No. 7,213,940, entitled "Lighting Device and Lighting Method". In one such arrangement a 452 nm peak blue InGaN LEDs were coated with a yellow conversion material, such as a YAG:Ce phosphor, to provide a color that was distinctly yellow and had a color point that fell well above the black body locus. This yellow emission can comprise blue light component that leaks through the yellow conversion material. The yellow emission is combined with the light from reddish AlInGaP LEDs that "pulls" the yellow color of the yellow LEDs to the black body curve to produce warm white light. FIG. 3 shows a CIE diagram 30 with the tie lines 32 between red light 34 from red emitting LEDs and various yellow and yellowish points on the blue/YAG tie line 36. With this approach, high efficacy warm white light with improved CRI can be generated. Some embodiments exhibited improved efficacy, with CRI Ra of greater than 90 at color temperatures below 3500 K.

This technique for generating warm white light generally comprises mixing blue, yellow and red photons (or lighting components) to reach color temperature of below 3500 K. The blue and yellow photons can be provided by a blue emitting LED covered by a yellow phosphor. The yellow photons are produced by the yellow phosphor absorbing some of the blue light and re-emitting yellow light, and the blue photons are provided by a portion of the blue light from the LED passing through the phosphor without being absorbed. The red photons are typically provided by red emitting LEDs, including reddish AlInGaP LEDs. Red LEDs from these materials can be temperature sensitive such that they can exhibit significant color shift and efficiency loss with increased temperature. This can result in luminaires using these LEDs emitting different colors of light different temperatures. To compensate for these variations, luminaires can include compensation circuitry that can vary the drive signal applied to the LEDs. This, however, can increase the cost and complexity of the luminaires. To avoid these costs and complexities, the red light can be provided by LEDs that are covered by a red phosphor that absorbs substantially all of the LED light and re-emits red light. The efficiency of these emitters, however, is limited by the relatively low conversion efficiency of red phosphors. This low conversion material efficiency can reduce the emission efficiency of the luminaire.

SUMMARY OF THE INVENTION

The present invention is directed to SSL luminaires or lamps that comprise solid state emitters that do not rely on temperature sensitive red LEDs or LED chips having CLED coated by a red phosphor operating in saturation. These luminaires can produce and consistent and efficient light without the need for costly and complex circuitry to compensate for emission variations at different temperatures. In some embodiments, the luminaires can combine emitters that produce yellow (or green) light components, and emitters that produce red and blue light components that combine to produce a white light with the desired color temperature.

One embodiment of a SSL luminaire according to the present invention comprises a plurality of first emitters providing a first light emission component. A plurality of second emitters is included each of which provides blue and red light emission components. The first light emission component and the blue and red lighting components combine so that the luminaire produces a white light.

Another embodiment of a SSL luminaire according to the present invention comprises a plurality of first light emitting diode (LED) chips each of which comprises blue shifted yellow (BSY) LED emitting a first light component. A plurality of second LED chips is included each of which comprises a blue LED coated by a red conversion material, with the second LED chips emitting blue and red light components. The SSL luminaire emits a combination of light from the first, blue and red lighting components with desired lighting characteristics.

One embodiment of an SSL luminaire light engine comprises a plurality of first LED chips mounted to a submount and emitting a first emission component. A plurality of second LED chips is also mounted to a submount and emitting blue and red emission components. Interconnects are included between the first and second LED chips to transmit an electrical signal to the first and second LED chips, wherein the light engine emits a white light combination of the first, blue and red emission components.

Another embodiment of a SSL luminaire according to the present invention comprises a plurality of first emitters each of which comprises an LED covered by a yellow conversion material in an amount sufficient to absorb substantially all of the LED light and emit yellow light. A plurality of second emitters is included each of which comprises a blue LED covered by a red conversion material in an amount sufficient to absorb some of the light from the blue LED so that each of the second emitters emits red and blue light. The yellow, red and blue light combines to produce white light with a color temperature in the range of 2700 to 4000 K.

Still another embodiment of an SSL luminaire according to the present invention comprises a plurality of first emitters each of which comprises an LED covered by a green conversion material in an amount sufficient to absorb substantially all of the LED light and emit green light. A plurality of second emitters is included each of which comprises a blue LED covered by a red conversion material in an amount sufficient to absorb some of light from the blue LED so that each of the second emitters emits red and blue light. The green, red and blue light combines to produce white light with a color temperature in the range of 2700 to 4000 K.

These and other aspects and advantages of the invention will become apparent from the following detailed description and the accompanying drawings which illustrate by way of example the features of the invention.

BRIEF DESCRIPTION OF THE DRAWINGS

FIG. 1 shows a sectional view of one embodiment of a prior art LED lamp;

FIG. 2 shows a sectional view of another embodiment of prior art LED lamp;

FIG. 3 is a CIE diagram showing the tie lines between BSY and red emitters;

DETAILED DESCRIPTION OF THE INVENTION

Figure 4:
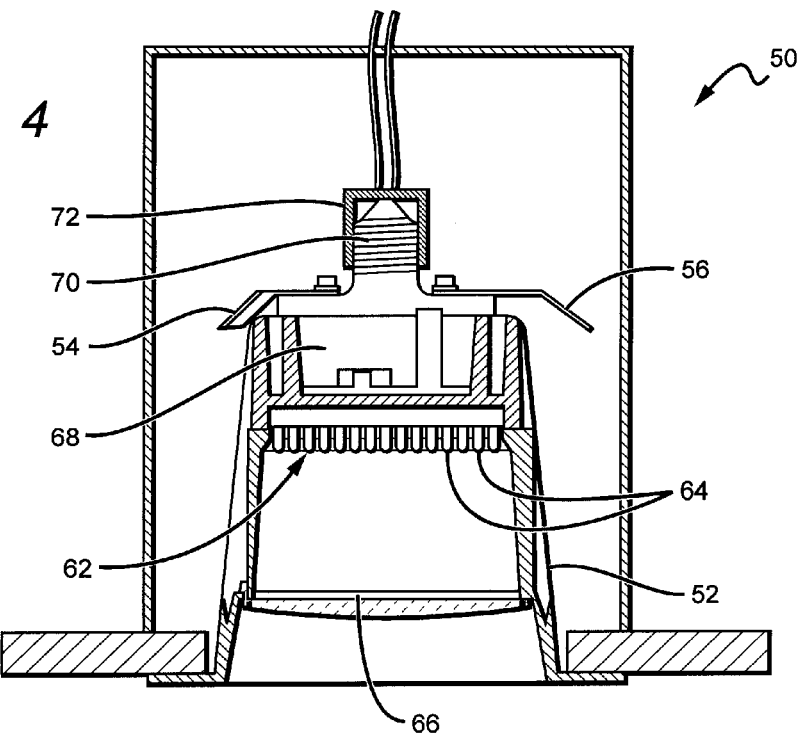
FIG. 4 is a sectional view of one embodiment of an SSL luminaire according to the present invention.

The present invention is directed to SSL lamps or luminaires (SSL luminaires) that combine blue, yellow/green (yellow) and red photons or emissions to generate light with the desired characteristics. In different embodiments according to the present invention, the blue emission is not provided by an LED chip or package (LED chip) having a blue LED coated with a yellow phosphor, with blue light leaking through the yellow phosphor. Instead, the blue light component can be provided by other types of LED chips in the SSL luminaire such as one having a blue LED covered by a different colored conversion material, with blue light from the blue LED leaking through the different colored conversion material. In one embodiment, the blue component can be provided by an LED chip comprising a blue emitting LED covered by a conversion material that absorbs blue light and re-emits red light, with a portion of the blue light from the LED leaking through the red conversion material.

In some embodiments, the yellow light component can be provided by an LED chip having an LED covered with a yellow or green conversion material that absorbs substantially all LED light so that the LED chip re-emits light from the yellow phosphor. These can be referred to as blue shifted yellow (BSY) LEDs with the understanding that reference to BSY chips encompassed blue chips coated by yellow phosphor as well as those coated by phosphors that re-emit in adjacent emission spectrums, such as green phosphors. In other embodiments according to the present, a green lighting component can be provided instead of a yellow component such as by a LED chip having a blue emitting LED covered by a green phosphor arranged to absorb all blue light and emit green light.

The combination of yellow (or green), red and blue from the luminaire's LED chips combine so that the luminaire emits white light with the desired temperature while not relying on red emission from temperature sensitive red emitters, such as reddish AlInGaP LEDs. Thus, luminaires according to the present invention can be provided without the complexity and cost of circuitry that compensates for the different emissions of red emitters at different temperatures. It also allows for luminaires that emit the desired white light more efficiently compared to luminaires that rely on red emission from LED chips comprising an LED covered by low efficiency red phosphors that absorb all of the blue light. The red light in embodiments according to the present invention is provided by phosphors not operating in saturation, which reduces the impact of the reduced efficiency for the red phosphors and provide for increased luminaire emission efficiency.

The present invention is described herein with reference to certain embodiments, but it is understood that the invention can be embodied in many different forms and should not be construed as limited to the embodiments set forth herein. In particular, the present invention is described below in regards to certain SSL luminaires having arrays of LED chips in different configurations. These are generally referred to as SSL luminaires, but it is understood that the present invention can be used for many other lamps having many different array configurations of different emitter types. The components can have different shapes and sizes beyond those shown and different numbers of LED chips can be included in the arrays. Some or all of the LED chips in the arrays can be coated with a conversion material that can comprise a phosphor loaded binder ("phosphor/binder coating"), but it is understood that LEDs without a conversion material can also be used. The luminaires according to the present invention are described as using arrays of LED chips as their light source, but it is also understood that many different arrangements of hybrid or discrete solid state lighting elements can be used to provide the desired combination of lighting characteristics.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, and/or sections, these elements, components, and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

It is understood that the arrangements described herein can be utilized in many different SSL luminaires having different features arranged in different ways. FIG. 4 shows one embodiment of an SSL luminaire 50 according to the present invention that can comprise a plurality of LED chips arranged according to the present invention. The luminaire 50 generally comprises a housing 52 that can be mounted in place in a fixture, wall or ceiling using many different mounting mechanisms. In the embodiment shown, the mounting mechanisms comprise a first mounting clip 54, a second mounting clip 56, and a third mounting clip (not visible in FIG. 4). A light engine 62 is arranged in the housing and comprises a plurality of solid state light emitters 64 that in this embodiment comprise LED chips. A diffuser 66 can be included over the housing opening, and a power supply/converter 68 is included. The housing 52 can also comprise an electrical connection region 70 which is engageable with an electricity supply device 72 (in this embodiment, an Edison socket).

The power supply/converter 68 can also be included that is positioned within the housing and can comprise a conventional rectifier and high voltage converter. If power comprising an AC voltage is supplied to luminaire 50, the power supply/converter 68 can convert the AC power and supplies energy to the light engine 62 in a form compatible with driving LED chips 64 so that they emit light.

In this embodiment, the diffuser 66 can be designed in such a manner to promote effective color mixing, depixelization, and high optical efficiency. The diffuser 66 can be attached to the housing 52 via mechanical snap-fit to the lower housing in such a manner that it requires the device to be uninstalled (powered down) to remove it, and/or the diffuser (lens) can be permanently attached (i.e., removal would require breakage), e.g., by heat staking, suitable heat staking techniques being well-known in the art.

As discussed above, the light engine 62 of the emitter 50 can be provided with a plurality of LED chips 64 that provide blue, yellow or red photons light components that combine to produce light with the desired characteristics. In one embodiment according to the present invention the LED chips 64 produce light with a color temperature in the range of 2700 K and 4000 K. In still other embodiments the LED chips 64 produce light with a color temperature in the range of 2800 K to 3500 K. In still other embodiments the LED chips 64 produce light with a 3000 K color temperature.

In some embodiments, the blue light component can be provided by one or more LED chips comprising a blue LED coated by a red conversion material, with the conversion material arranged such that some or the blue light from the LED leaks through the conversion material. The red light component is provided by the red conversion material absorbing some of the blue light and re-emitting red light. Thus, each of the blue LEDs coated by the red phosphor emits red light from the phosphor and blue from LED. The yellow emission component can be provided LED chips having one or more blue or UV LED coated by a yellow or green phosphor such that all, or substantially all, of the blue LED light is absorbed by yellow phosphor. The resulting emission is primarily yellow or green, depending on the type of phosphor. The resulting emission of the light engine 62 comprises the yellow, red and blue components that combine to produce a white light with the desired temperature.

Figure 5:
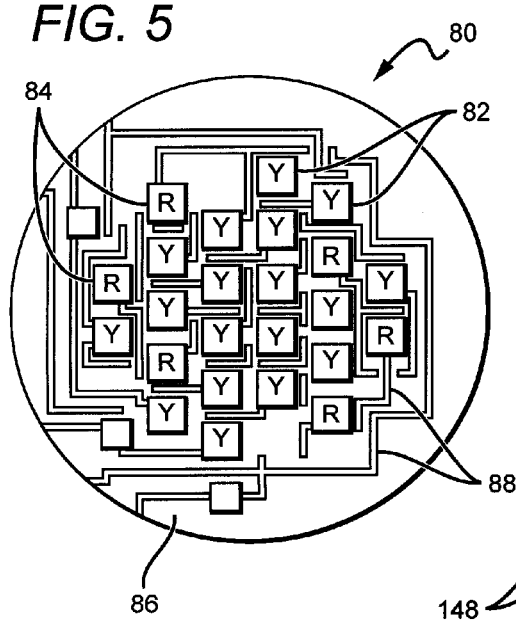
FIG. 5 is a plan view of one embodiment of a SSL luminaire light engine according to the present invention.

FIG. 5 shows one embodiment of a light engine 80 according to the present invention in more detail that can comprise a plurality of LED chips that provide yellow, red and blue light components. In this embodiment the light engine 80 produces yellow light from first LED chips 82 that can comprise blue LEDs coated by a yellow phosphor, with the yellow phosphor absorbing blue light and emitting yellow light. The LED chips 82 can be covered with sufficient amount of yellow phosphor such that all, or substantially all, of the blue LED emission is absorbed by the yellow phosphor and the LED chips 82 emit primarily yellow re-emitted light from the yellow phosphor. In some embodiments, all the blue light is absorbed by the yellow phosphor such the LED chips 82 emit only yellow light. Many different blue LEDs can be used in the LED chips made of many different material systems, such as materials from the Group-III nitride material system. LED structures, features, and their fabrication and operation are generally known in the art and accordingly are not discussed herein.

Many different yellow phosphors can be used in the LED chips 82 such as commercially available YAG:Ce phosphors, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Some additional yellow phosphors that can be used in LED chips 82 can include:
$Tb_{3-x}RE_xO_{12}$:Ce(TAG); RE=Y, Gd, La, Lu; or
$Sr_{2-x-y}Ba_xCa_ySiO_4$:Eu.

The LED chips 82 can be coated with the yellow phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LED chips can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that other conventional coating methods can be used, including but not limited to spin coating.

The red and blue components of emission from the light engine 80 can be provided second LED chips 84 each of which can comprise an LED coated by a red conversion material such as a red phosphor. The LED chips 84 can comprise different LEDs with some embodiments comprising blue emitting LEDs similar to those described above and utilized in first LED chips 82. An alternative LED can comprise an ultraviolet (UV) emitting LED, although it is understood that LED emitting different colors can also be used. In this embodiment, the blue LEDs can be covered by a red phosphor in an amount sufficient to absorb a portion of the blue LED light and re-emit red light, while still allowing a desired portion of the blue light to pass through the red phosphor unconverted. Many different phosphors can be used in the LEDs 84, including but not limited to:
$Lu_2O_3$:$Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:$Pr^{3+}$,$Ga^{3+}$
$CaAlSiN_3$:$Eu^{2+}$
$Sr_2Si_5N_8$:$Eu^{2+}$ The LEDs in LED chips 84 can be fabricated using the same known steps that can be used for LED chips 84 and can be coated using the methods described above.

For both the first and second LED chips 82, 84 different factors determine the amount of LED light that can be absorbed by the yellow and red conversion materials, and accordingly determines the necessary amount of conversion material needed in each. Some of these factors include but are not limited to the size of the phosphor particles, the type of binder material, the efficiency of the match between the type of phosphor and wavelength of emitted LED light, and the thickness of the phosphor/binding layer.

Different sized phosphor particles can also be used including but not limited to particles in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light. The phosphors in the LED chips 82, 84 can also have different concentrations or loading of phosphor materials in the binder, with a typical concentration being in range of 30-70% by weight. In some embodiments, the phosphor concentration can be approximately 65% by weight, and can be uniformly dispersed throughout the phosphor coatings, although it is understood that in some embodiments it can be desirable to have phosphors in different concentrations in different regions. The appropriate thickness of the phosphor coating over the LEDs in the first and second LED chips 82, 84 can be determined by taking into account the above factors in combination with the luminous flux of the particular LEDs.

The first and second LED chips 82, 84 can be mounted to a submount, substrate or printed circuit board (PCB) 86 ("submount") that can have conductive traces 88 that can connect the LED chips in different serial and parallel arrangements. The submount 86 can be formed of many different materials with a preferred material being electrically insulating, such as a dielectric. The submount can also comprise ceramics such as alumina, aluminum nitride, silicon carbide, or a polymeric material such as polyimide and polyester etc. In some embodiments the submount 86 can comprise a material having a high thermal conductivity such as with aluminum nitride and silicon carbide. In other embodiments the submount 86 can comprise highly reflective material, such as reflective ceramic or metal layers like silver, to enhance light extraction from the component. In other embodiments the submount 86 can comprise a printed circuit board (PCB), sapphire, silicon carbide or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board. The size of the submount 86 can vary depending on different factors, with one being the size and number of LED chips 82, 84.

The submount 86 can also comprise die pads and conductive traces 88 that can be many different materials such as metals or other conductive materials. In one embodiment they can comprise copper deposited using known techniques such as plating and can then be patterned using standard lithographic processes. In other embodiments the layer can be sputtered using a mask to form the desired pattern. In some embodiments according to the present invention some of the conductive features can include only copper, with others including additional materials. For example, the die pads can be plated or coated with additional metals or materials to make them more suitable for mounting of LED chips. In one embodiment the die pads can be plated with adhesive or bonding materials, or reflective and barrier layers. The LED chips can be mounted to the die pads using known methods and materials such as using conventional solder materials that may or may not contain a flux material or dispensed polymeric materials that may be thermally and electrically conductive. In some embodiments wire bonds can be included, each of which passes between one of the conductive traces 88 and one of the LED chips 82, 84 and in some embodiment an electrical signal is applied to the LED chips 82, 84 through its respective one of the die pads and the wire bonds.

Figure 6:
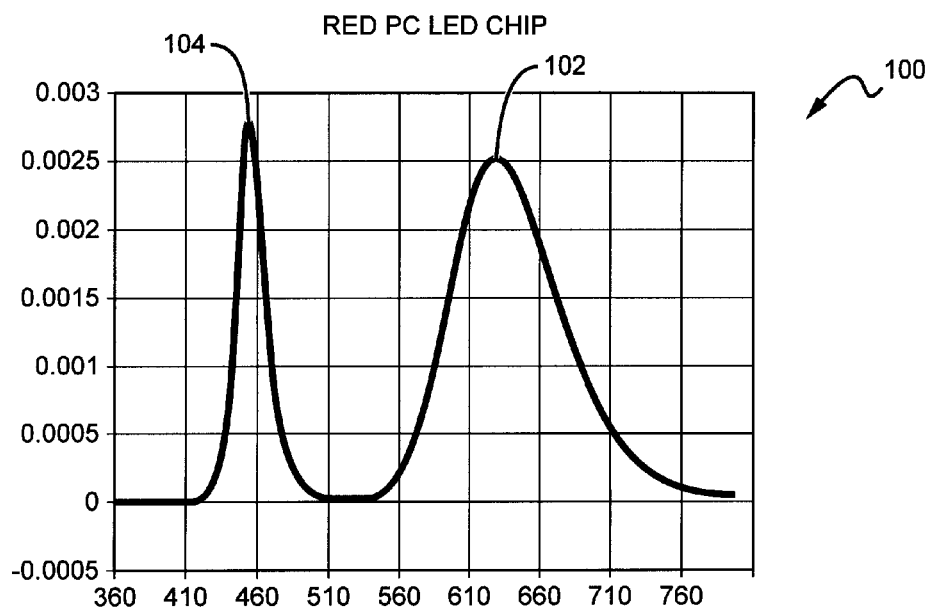
FIG. 6 is a graph showing emission characteristics for a first type of LED chip that can be used in the light engine of FIG. 5.
Figure 7:
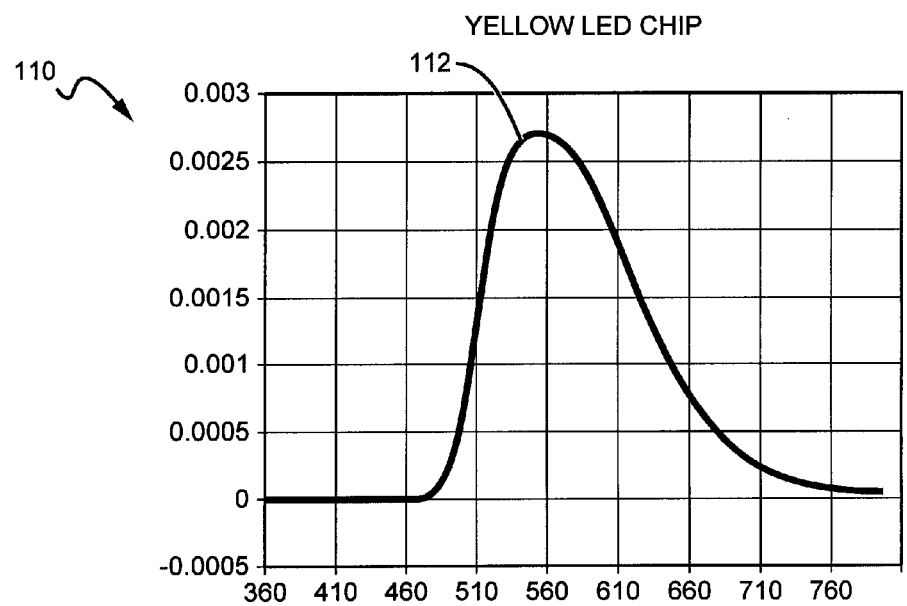
FIG. 7 is a graph showing the emission characteristics for a second type of LED chip that can be used in the light engine of FIG. 5.

The LED chips 82, 84 can exhibit many different emission characteristics, and FIG. 6 shows a graph 100 illustrating the emission characteristics for one embodiment of the second LED chips 84 according to the present invention. The peak red emission component 102 is at approximately 630 nm and is provided by the converted light from the red phosphor. The blue peak emission component 104 is at approximately 470 nm and is provided by blue light from the LED that leaks through the red phosphor. FIG. 7, is a graph 110 showing the emission characteristics for one embodiment of the first LED chips according to the present invention. The peak emission 112 is at approximately 560 nm and is provided by the converted light from the yellow phosphor. Substantially all or all of the blue LED light is absorbed by the yellow phosphor so that the LEDs 82 only have a yellow emission component. As discussed above, the yellow, red and blue light components can combine to produce white light with the desired temperature.

Figure 8:
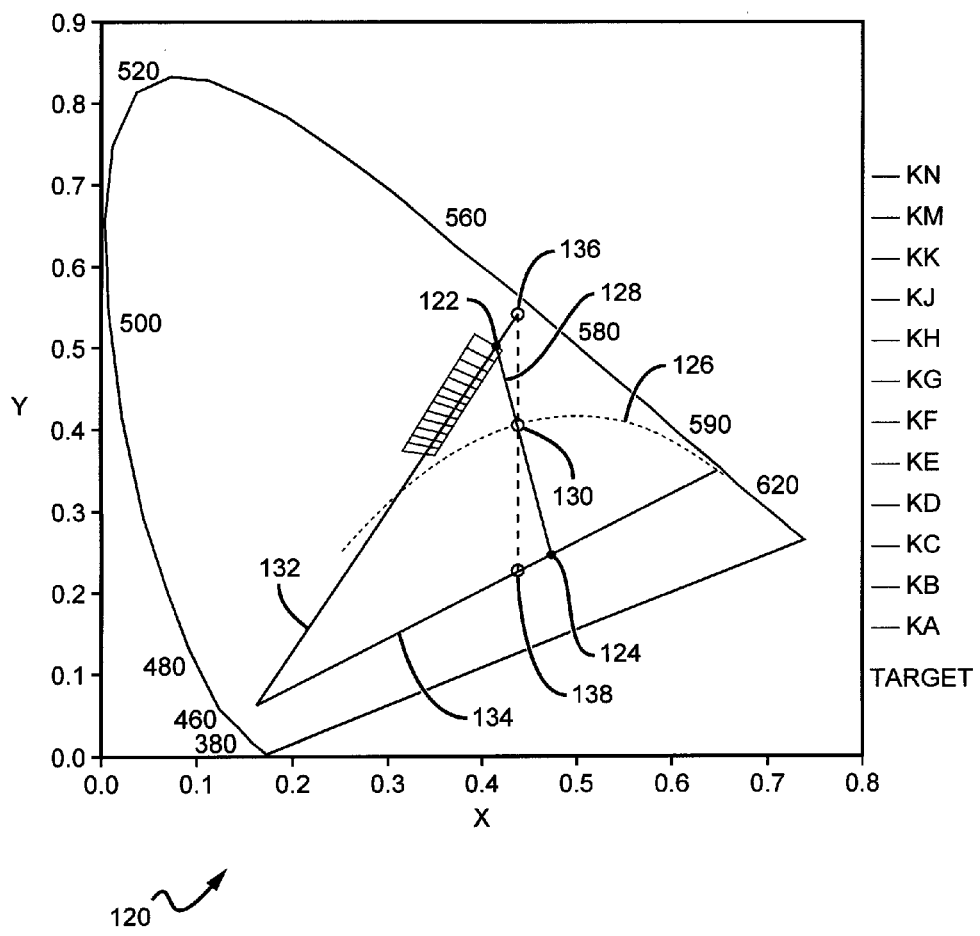
FIG. 8 is a CIE diagram showing the emission characteristics for a first and second type LED chips that can be used in the light engine of FIG. 5.

FIG. 8 shows a 1931 CIE Chromaticity Diagram 120 showing the approximate emission point 122 for the first LED chips 82 and the emission point 124 for the second LED chips 84. Each point has respective x, y coordinates within the diagram, and the block body locus (BBL) 126 runs between the emission points 122, 124. A tie line 128 is shown running between the emission points 122, 124, with emission point 122 being yellow and above the BBL 126, and emission point 124 being red/blue and below the BBL 126. When the colors from points 122 and 124 are combined, the yellow light from point 122 is pulled down red/blue light from color point 124 so that overall emission is within a acceptable standard deviation from a target point 130 on the BBL 126. In one embodiment, the target point on the BBL has an approximate color temperature of 3,000 k and one embodiment of a standard deviation from this point is a 4-step MacAdam ellipses although other standard deviations can also be used. It is understood that the target point on the BBL can be different and the standard deviation can also be different.

The relative proximities of the yellow and red/blue color points 122, 124 to the BBL 126 results in different ratios of light necessary from the first and second LED chips 82, 84 emitters. That is, because the yellow point 122 is closer to the BBL, it takes only enough red/blue light necessary to pull it the distance between the yellow point 122 and the BBL 126. The red/blue color point 124 is further from the BBL, and accordingly it takes a smaller ratio of red light to pull the yellow light to the BBL. In one embodiment the ratio of light from the first LED chips 82 and the second LED chips 84 can be 3 to 1, assuming the underlying blue emitters have approximately the same luminous flux. Other factors can also impact the ratio of emitters, such as the conversion efficiency of the respective phosphors in the coatings. Accordingly, different ratios of emitters can be used in other embodiments according to the present invention.

It is understood that the SSL luminaires can comprise different first and second LED chips emitting at different color points that can be combined to achieve the desired color point within the standard deviation of the BBL. In different embodiments the first LED chips can emit different wavelengths of light in the yellow emission spectrum such that their emission point in a CIE diagram would be different from the point 122 shown above in FIG. 8. This in turn can result in the need for the second LED chips that emit at a different red/blue color point different from point 124 in FIG. 8 to get the desired color point at or near the BBL. FIG. 8 shows one example of the emission line 132 that comprises the different emission points for the first LED chips depending on the amount of yellow conversion material, with the emissions ranging from primarily blue to primarily yellow. A similar emission line 134 is provided for the second LED chips, with the emissions ranging from primarily blue to primarily red. When the emission point from first emitters moves from point 122 in a direction such that it emits more yellow as shown by emission point 136, the corresponding emission from the second emitters moves from point 124 in a direction such that the second LED chips have more of a blue component as shown by emission point 138. This complimentary change in emission points results in the color point 138 provided by the emission from the second LED chips pulling the emission from emission point 136 toward the BBL 126 so that it is still within at or within a standard deviation of the desired color temperature. It is understood that there can be many different combinations of emission points along the emission lines 132, 134, with the emission points from the first LED chips along emission line 132 having a corresponding emission point from the second LED chips on emission line 134 that combine to obtain the desired color temperature.

Figure 9:
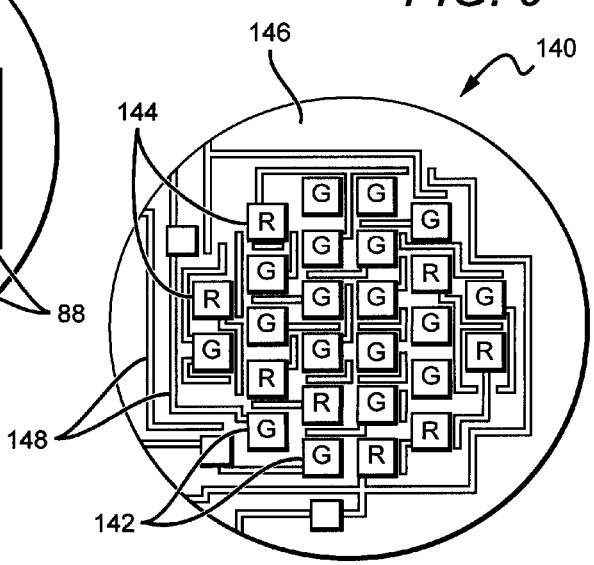
FIG. 9 is a plan view of one embodiment of a SSL luminaire light engine according to the present invention.

It is understood that the present invention can be used with many different types of LEDs chips whose light combines to achieve the desired emission intensity and temperature. FIG. 9 shows another embodiment of a light engine 140 according to the present invention that is similar to the light engine 80 in FIG. 5. In this embodiment, however, the light engine 140 produces green, red and blue emission components, with the green light produced by blue-green phosphor coated LED chips 142 with the green phosphor that absorbs blue light and re-emits green light. The LED chips 142 can be covered with sufficient amount of green phosphor such that all or substantially all of the blue LED emission is absorbed by the green phosphor and the LED chips 142 emit primarily green re-emitted light from the green phosphor. In some embodiments all of the blue light is absorbed by the green phosphor such that the LED chips 142 emit only green light. Many different green phosphors can be used in the LED chips 142 to generate green light including but not limited to the following:

$SrGa_2S_4$:Eu;
$Sr_{2-y}Ba_ySiO_4$:Eu; or
$SrSi_2O_2N_2$:Eu.

The red and blue components of emission from the light engine can be provided by second LED chips 144 that are similar to the LED chips 84 described above. The LED chips 144 can comprise blue emitters covered by one of the red phosphors described above in an amount sufficient to absorb a portion of the blue light and re-emit red light. The red phosphor should also be arranged to allow a desired portion of the blue light to pass through the red phosphor unconverted. The first and second LED chips 142, 144 can also be arranged on a submount 146 with interconnects 148 that are similar to the submount 86 and interconnects 88 described above.

Figure 10:
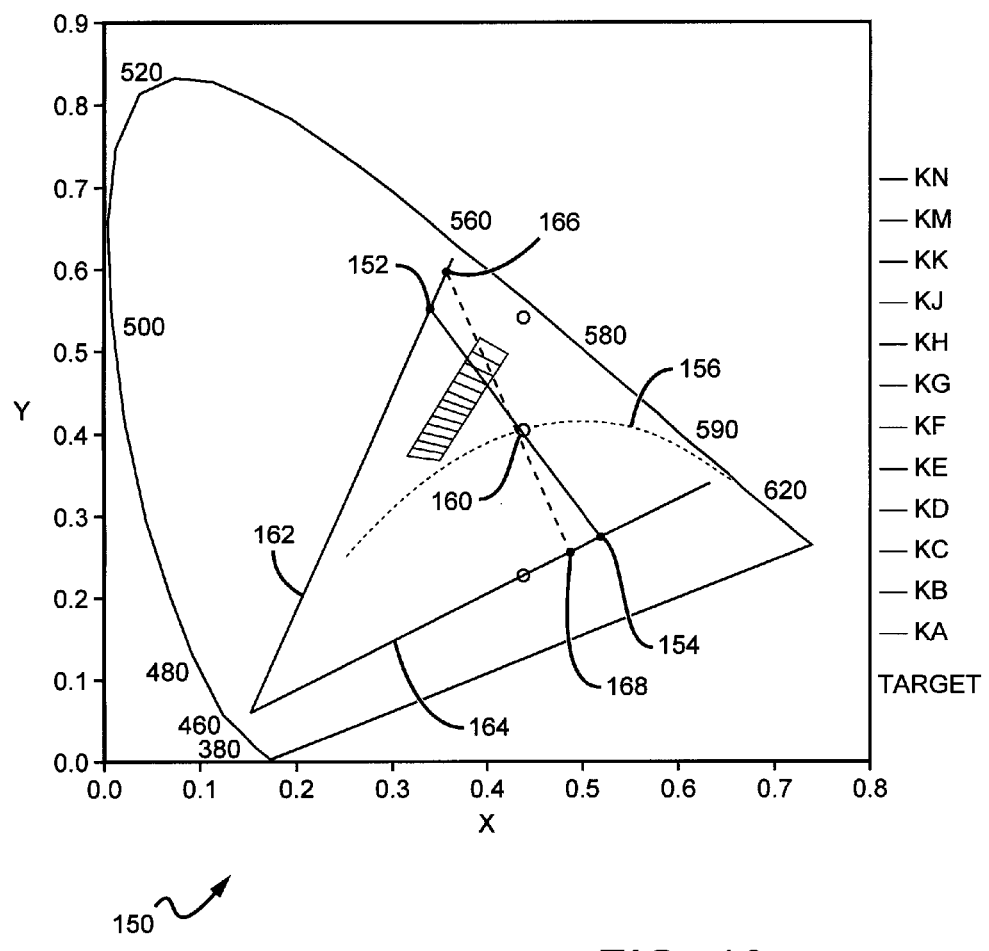
FIG. 10 is a CIE diagram showing the emission characteristics for a first and second type LED chips that can be used in the light engine of FIG. 9.

FIG. 10 shows a 1931 CIE Chromaticity Diagram 150 showing the approximate emission point 152 for the first LED chips 142 and the emission point 154 for the second LED chips 144. Each point has respective x, y coordinates within the diagram, and the block body locus (BBL) 156 runs between the emission points 152, 154. Similar to FIG. 8 above, a tie line 168 is shown connecting the emission points 152, 154, with emission point 152 being above the BBL 156 and emission point 154 being below the BBL 166. When the colors from points 152 and 154 combine, the green light from point 152 is pulled down so that it is within an acceptable standard deviation from a target color temperature point 160 on the BBL 156. In one embodiment, the target point on the BBL has an approximate color temperature of 3,000 k and one embodiment of a standard deviation from this point is a 4-step MacAdam ellipses. It is understood that the target point on the BBL can be different and the standard deviation can also be different.

The relative proximities of the green and red/blue color points 152, 154 to the BBL 156 results in different ratios of light from the green and red/blue emitters. In contrast to the yellow and red/blue LED chips described above, the green color point 152 is approximately equal distance to the BBL 156 as the red/blue color point 154. Accordingly the amount of red/blue light necessary to pull the green light to the BBL is approximately the same as the amount of green light. Accordingly, the ratio of light from the green emitters and red/blue emitters can be approximately 1 to 1. Assuming the underlying LEDs have approximately the same luminous flux for first LED chips 142 and second LED chips 144, the number of first and second LED chips can be approximately equal. Other factors can also impact the ratio of emitters, such as the conversion efficiency of the respective phosphors in the coatings. Accordingly, different ratios of emitters can be used in other embodiments according to the present invention.

FIG. 10 shows the emission line 162 that comprises the different emission points for the first LED chips depending on the amount of green conversion material, with the emissions ranging from primarily blue to primarily green. A similar emission line 164 is provided for the second LED chips, with the emissions ranging from primarily blue to primarily red. When the first LED chips are arranged so that the emission point moves in a direction such that it emits more green as shown by emission point 166, the corresponding emission from the second emitters moves in a direction such that the second LED chips have more of a blue component as shown by emission point 168. This complimentary change in emission points results in the emission point 168 provided by the emission from the second LED chips pulling the emission from emission point 166 toward the BBL 156 so that it is still within at or within a standard deviation of the desired color temperature. The emission points from the first LED chips along emission line 162 can have a corresponding emission point from the second LED chips on emission line 164 to obtain the desired color temperature.

The above embodiments were described with reference to particular LED chips utilizing particular conversion materials. In particular, the first LED chips are described as having LEDs covered with either a yellow or green phosphor. It is understood that other embodiments of these first and second LED chips can have many different types of LEDs emitting different colors of light, and can be coated by many different types and colors of conversion materials beyond those described above.

It is also understood that other yellow, green and red conversion materials can be used and the following lists some additional suitable phosphors that can be used in the according to the present invention. Each exhibits excitation in the blue emission spectrum, provides a desirable peak emission, has efficient light conversion, and has acceptable Stokes shift:

Yellow/Green
$(Sr,Ca,Ba)(Al,Ga)_2S_4$:$Eu^{2+}$
$Ba_e(Mg,Zn)Si_2O_7$:$Eu^{2+}$
$Gd_{0.46}Sr_{0.31}Al_{1.23}O_xF_{1.38}$:$Eu^{2+}{}_{0.06}$
$(Ba_{1-x-y}Sr_xCa_y)SiO_4$:Eu
$Ba_2SiO_4$:$Eu^{2+}$ Red
$Lu_2O_3$:$Eu^{3+}$
$(Sr_{2-x}La_x)(Ce_{1-x}Eu_x)O_4$ $Sr_2Ce_{1-x}Eu_xO_4$
$Sr_{2-x}Eu_xCeO_4$
$SrTiO_3:Pr^{3+}, Ga^{3+}$
$CaAlSiN_3:Eu^{2+}$
$Sr_2Si_5N_8:Eu^{2+}$ The present invention has been described with reference to light engines having first and second LED chips that emit light with respective characteristics. It is understood that other light engines according to the present invention can have three or more different types of LED chips, with each type emitting with respective characteristics. The different emission points from these emitters can be combined to provide the desired color temperature on the BBL, or can be within a standard of a color temperature on the BBL, as described above. One such arrangement is described in U.S. patent application Ser. No. 12/288,957 entitled "Array Layout For Color Mixing" to van de Ven et al., which is incorporated herein by reference Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. Therefore, the spirit and scope of the invention should not be limited to the versions described above.

We claim:

1. A solid state lighting (SSL) luminaire, comprising:
a plurality of first emitters configured such that all light emitted from said plurality of first emitters is emitted by a wavelength conversion material to provide a first light emission component; and
a plurality of second emitters each of which provides blue and red light emission components, wherein said first light emission component and said blue and red lighting components combine so that said luminaire produces a white light, wherein the blue light component of said white light is substantially provided from said blue and red light emission components.

2. The luminaire of claim 1, wherein said first light emission component comprises yellow light.

3. The luminaire of claim 1, wherein each of said first emitters comprises an LED coated by a yellow conversion material that absorbs substantially all of the light from said LED with said first emitters emitting substantially yellow light.

4. The luminaire of claim 3, wherein said LED in each of said first emitters comprises a blue or ultraviolet emitting LED.

5. The luminaire of claim 1, wherein said first light emission component comprises green light.

6. The luminaire of claim 1, wherein each of said first emitters comprises an LED coated by a green conversion material that absorbs substantially all of the light from said LED, with said first emitters emitting substantially green light.

7. The luminaire of claim 6, wherein said LED in each of said first emitters comprises a blue or ultraviolet emitting LED.

8. The luminaire of claim 1, wherein each of said second emitters comprises a blue emitting LED coated by a red conversion material that absorbs blue light and re-emits red light.

9. The luminaire of claim 8, wherein said red conversion material absorbs less than all of said blue light, with a portion of said blue light passing through said red conversion material.

10. The luminaire of claim 1, emitting white light with color temperature in the range of 2700 to 4000 K.

11. The luminaire of claim 1, emitting white light with a color temperature in the range of 2800 to 3500 K.

12. The luminaire of claim 1, emitting white light with a color temperature within a standard deviation of 3000 k.

13. The luminaire of claim 1, wherein said emitters provide a yellow lighting component, wherein the ratio of first to second emitters is approximately 3 to 1.

14. The luminaire of claim 1, wherein said emitters provide a green lighting component, wherein the ratio of first to second emitters is approximately 1 to 1.

15. A solid state lighting (SSL) luminaire, comprising:
a plurality of first light emitting diode (LED) chips each of which comprises saturated blue shifted yellow (BSY) LEDs emitting a first light component; and
a plurality of second LED chips each of which comprises a blue LED coated by a red conversion material, said second LED chips emitting blue and red light components with said SSL luminaire emitting a combination of light from said first, blue and red lighting components with desired lighting characteristics, said combination of light comprising a blue light component, wherein said blue light component of said combination of light is substantially provided from said blue LEDs coated by a red conversion material.

16. The luminaire of claim 15, wherein each of said first LED chips comprises a blue LED coated by a yellow phosphor in a sufficient amount such that said yellow phosphor absorbs substantially all of the light from said LED and re-emits yellow light.

17. The luminaire of claim 16, emitting white light and comprising a ratio of first LED chips and second LED chips of approximately 3 to 1.

18. The luminaire of claim 15, wherein each of said first LED chips comprises a blue LED coated by a green phosphor in a sufficient amount such that said green phosphor absorbs substantially all of the light from said LED and re-emits green light.

19. The luminaire of claim 18, emitting white light and comprising a ratio of first LED chips and second LED chips of approximately 1 to 1.

20. The luminaire of claim 15, wherein said red conversion material in each of said second emitters absorbs less than all of the light from said blue LED, with a portion of said blue light passing through said red conversion material.

21. The luminaire of claim 15, emitting white light with a color temperature in the range of 2800 to 3500 K.

22. A light engine, comprising:
a plurality of first LED chips mounted to a submount and emitting only a first emission component of a single color;
a plurality of second LED chips mounted to said submount and emitting blue and red emission components; and
interconnects between said first and second LED chips to transmit an electrical signal to said first and second LED chips, wherein said light engine emits a white light combination of said first, blue and red emission components, wherein the blue emission component of said white light combination is substantially provided from said second LED chips emitting blue and red light emission components.

23. The light engine of claim 22, wherein each of said first LED chips comprises an LED coated by a yellow conversion material that absorbs substantially all of the light from said LED with said first LED chips emitting substantially yellow light.

24. The light engine of claim 22, wherein each of said first LED chips comprises an LED coated by a green conversion material that absorbs substantially all of the light from said LED, with said LED chips emitting substantially green light.

25. The light engine of claim 22, wherein each of said second LED chips comprise a blue emitting LED coated by a red conversion material that absorbs blue light and re-emits red light.

26. The light engine of claim 25, wherein said red conversion material absorbs less than all of said blue light, with a portion of said blue light passing through said red conversion material.

27. The light engine of claim 22, emitting white light with color temperature in the range of 2700 to 4000 K.

28. A solid state lighting (SSL) luminaire, comprising:
a plurality of first emitters each of which comprises an LED covered by a yellow conversion material in an amount sufficient to absorb all of said LED light and emit yellow light; and
a plurality of second emitters each of which comprises a blue LED covered by a red conversion material in an amount sufficient to absorb some of the light from said blue LED so that each of said second emitters emits red and blue light, said yellow, red and blue light combining to produce white light with a color temperature in the range of 2700 to 4000 K, wherein the blue light component of said white light is substantially provided from said blue LED covered by a red conversion material.

29. The luminaire of claim 28, wherein the ratio of first to second emitters is approximately 3 to 1.

30. A solid state lighting (SSL) luminaire, comprising:
a plurality of first emitters each of which comprises an LED covered by a green conversion material in an amount sufficient to absorb all of said LED light and emit green light; and
a plurality of second emitters each of which comprises a blue LED covered by a red conversion material in an amount sufficient to absorb some of the light from said blue LED so that each of said second emitters emits red and blue light, said green, red and blue light combining to produce white light with a color temperature in the range of 2700 to 4000 K, wherein the blue light component of said white light is substantially provided from said blue LED covered by a red conversion material.

31. The luminaire of claim 30, wherein the ratio of first to second emitters is approximately 1 to 1.

32. A solid state lighting (SSL) luminaire, comprising:
a plurality of first blue shifted yellow (BSY) emitters providing only a first light component of wavelength-converted light; and
a plurality of second emitters each of which comprises a blue light emitting diode (LED) coated by a red-emitting phosphor, each of said second emitters providing a blue light component from said blue LED and a red light component from said red-emitting phosphor, wherein said first, blue, and red light components combine to produce a white light with a color temperature in the range of 2700 to 4000 K, wherein the blue light component of said white light is substantially provided from said blue LED coated by a red-emitting phosphor.

33. A solid state lighting (SSL) luminaire, comprising:
a first emitter providing only a first light component of a single color and comprising an emission point above a black body locus (BBL) in a CIE Chromaticity diagram; and
a second emitter providing blue and red light emission components and comprising an emission point below said BBL, wherein said first light emission component and said blue and red light emission components combine so that said luminaire produces light within a standard deviation of said BBL, said light comprising a blue light component, wherein said blue light component of said light is substantially provided from said blue and red light emission components.

34. The luminaire of claim 33, wherein said first light emission component comprises yellow light.

35. The luminaire of claim 33, wherein said first emitter comprises an LED coated by a yellow conversion material that absorbs substantially all of the light from said LED, with said first emitter emitting substantially yellow light.

36. The luminaire of claim 35, wherein said LED in said first emitter comprises a blue emitting LED.

37. The luminaire of claim 33, wherein said first light emission component comprises green light.

38. The luminaire of claim 33, wherein said first emitter comprises an LED coated by a green conversion material that absorbs substantially all of the light from said LED, with said first emitter emitting substantially green light.

39. The luminaire of claim 38, wherein said LED in each of said first emitters comprises a blue emitting LED.

40. The luminaire of claim 33, wherein said second emitter comprises a blue emitting LED coated by a red conversion material that absorbs blue light and re-emits red light.

41. The luminaire of claim 33, wherein said red conversion material absorbs less than all of said blue light, with a portion of said blue light passing through said red conversion material.

42. The luminaire of claim 33, emitting white light with color temperature in the range of 2700 to 4000 K.

43. The luminaire of claim 33, emitting white light with a color temperature in the range of 2800 to 3500 K.

44. The luminaire of claim 33, emitting white light with a color temperature within a standard deviation of 3000 k on said BBL.

45. The luminaire of claim 33, wherein said standard deviation is a within a MacAdam ellipses.

46. The luminaire of claim 33, wherein said standard deviation is a 4-step MacAdam ellipses.

* * * * *